(12) United States Patent
Kang et al.

(10) Patent No.: US 10,217,709 B2
(45) Date of Patent: Feb. 26, 2019

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Seon Ha Kang, Suwon-si (KR); Myung Sam Kang, Suwon-si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/668,351

(22) Filed: Aug. 3, 2017

(65) Prior Publication Data

US 2018/0102322 A1 Apr. 12, 2018

(30) Foreign Application Priority Data

Oct. 10, 2016 (KR) .................. 10-2016-0130928

(51) Int. Cl.
*H01L 23/02* (2006.01)
*H01L 23/538* (2006.01)
(Continued)

(52) U.S. Cl.
CPC ...... *H01L 23/5389* (2013.01); *H01L 21/4853* (2013.01); *H01L 21/4857* (2013.01); *H01L 21/565* (2013.01); *H01L 23/3114* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 21/568* (2013.01); *H01L 23/562* (2013.01); *H01L 25/105* (2013.01); *H01L 2224/04105* (2013.01); *H01L 2224/12105* (2013.01); *H01L 2224/16227* (2013.01);
(Continued)

(58) Field of Classification Search
CPC ............. H01L 23/5383; H01L 23/5389; H01L 23/3114
USPC .......................................................... 257/778
See application file for complete search history.

(56) References Cited

U.S. PATENT DOCUMENTS 8,378,477 B2* 2/2013 Do ................. H01L 21/566
257/685
8,980,691 B2* 3/2015 Lin ................. H01L 25/50
257/686

(Continued)

FOREIGN PATENT DOCUMENTS

CN 102024684 A 4/2011
CN 103168358 A 6/2013

(Continued)

OTHER PUBLICATIONS

Office Action issued in correesponding Taiwanese Patent Application No. 106125237, dated Jul. 6, 2018.

(Continued)

*Primary Examiner* — Nitin Parekh
(74) *Attorney, Agent, or Firm* — Morgan, Lewis & Bockius LLP

(57) ABSTRACT

The present disclosure relates to a semiconductor package, and more particularly, to a fan-out semiconductor package in which connection terminals may extend outwardly of a region in which a semiconductor chip is disposed. In the fan-out semiconductor package, a circuit density of a redistribution layer may be increased even in a limited area.

20 Claims, 11 Drawing Sheets

(51) Int. Cl.
*H01L 23/31* (2006.01)
*H01L 21/48* (2006.01)
*H01L 21/56* (2006.01)
*H01L 23/00* (2006.01)
*H01L 25/10* (2006.01)

(52) U.S. Cl.
CPC .... *H01L 2224/19* (2013.01); *H01L 2224/214* (2013.01); *H01L 2225/1035* (2013.01); *H01L 2225/1041* (2013.01); *H01L 2225/1058* (2013.01); *H01L 2225/1094* (2013.01); *H01L 2924/10252* (2013.01); *H01L 2924/10253* (2013.01); *H01L 2924/10329* (2013.01); *H01L 2924/1432* (2013.01); *H01L 2924/14335* (2013.01); *H01L 2924/18162* (2013.01); *H01L 2924/19041* (2013.01); *H01L 2924/19042* (2013.01); *H01L 2924/19105* (2013.01); *H01L 2924/3025* (2013.01); *H01L 2924/3511* (2013.01); *H01L 2924/37001* (2013.01)

(56) References Cited

U.S. PATENT DOCUMENTS

| | | | |
|---|---|---|---|
| 9,269,622 B2 | 2/2016 | Scanlan et al. | |
| 9,728,498 B2* | 8/2017 | Su | H01L 25/105 |
| 2004/0014317 A1* | 1/2004 | Sakamoto | H01L 21/568 |
| | | | 438/689 |
| 2009/0309202 A1* | 12/2009 | Hsu | H01L 23/3128 |
| | | | 257/680 |
| 2011/0062549 A1 | 3/2011 | Lin | |
| 2012/0013021 A1 | 1/2012 | Kobayashi et al. | |
| 2012/0074586 A1* | 3/2012 | Seo | H01L 25/16 |
| | | | 257/774 |
| 2012/0119379 A1 | 5/2012 | Koizumi et al. | |
| 2014/0036454 A1* | 2/2014 | Caskey | H01L 25/0655 |
| | | | 361/735 |
| 2014/0264839 A1* | 9/2014 | Tsai | H01L 24/97 |
| | | | 257/737 |
| 2015/0008586 A1 | 1/2015 | Tsai et al. | |
| 2015/0102503 A1* | 4/2015 | Lin | H01L 21/486 |
| | | | 257/774 |
| 2016/0043047 A1 | 2/2016 | Shim et al. | |
| 2016/0172402 A1* | 6/2016 | Katkar | H01L 27/1464 |
| | | | 257/292 |
| 2016/0233194 A1 | 8/2016 | Chen et al. | |
| 2017/0092626 A1* | 3/2017 | Yuan | H01L 25/074 |

FOREIGN PATENT DOCUMENTS

| | | |
|---|---|---|
| JP | 2012-039090 A | 2/2012 |
| KR | 10-2010-0061069 A | 6/2010 |
| KR | 10-2013-0132162 A | 12/2013 |
| KR | 10-2015-0004739 A | 1/2015 |
| KR | 10-2016-0024379 A | 3/2016 |
| TW | 201618196 A | 5/2016 |
| TW | 201630130 A | 8/2016 |
| WO | 2012/012338 A1 | 1/2012 |
| WO | 2015/026344 A1 | 2/2015 |

OTHER PUBLICATIONS

Office Action issued in corresponding Korean Patent Application No. 10-2016-0130928, dated Sep. 18, 2018.

\* cited by examiner

I - I'

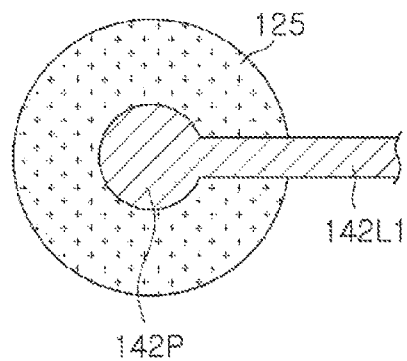
FIG. 11A
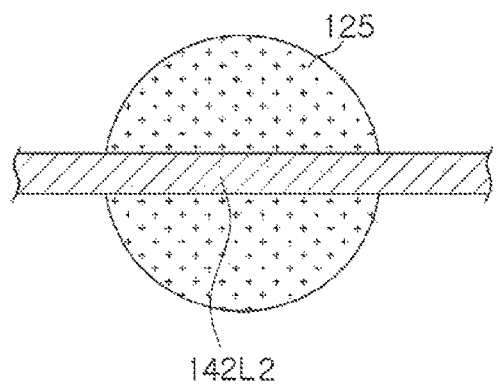 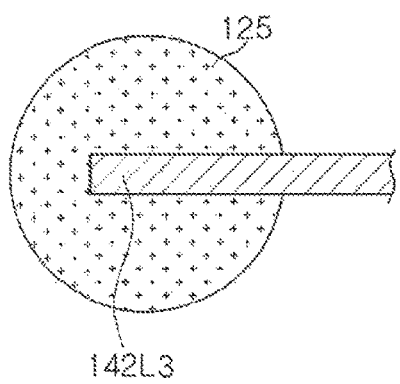
FIG. 11B  FIG. 11C

FAN-OUT SEMICONDUCTOR PACKAGE

CROSS-REFERENCE TO RELATED APPLICATION(S)

This application claims benefit of priority to Korean Patent Application No. 10-2016-0130928 filed on Oct. 10, 2016 in the Korean Intellectual Property Office, the disclosure of which is incorporated herein by reference in its entirety.

TECHNICAL FIELD

The present disclosure relates to a semiconductor package, and more particularly, to a fan-out semiconductor package in which connection terminals may extend outwardly of a region in which a semiconductor chip is disposed.

BACKGROUND

Recently, a significant trend in the development of technology related to semiconductor chips has been to reduce the size of semiconductor chips. Therefore, in the field of package technology, in accordance with a rapid increase in demand for small-sized semiconductor chips, and the like, the implementation of a semiconductor package having a compact size, while including a plurality of pins, has been demanded.

One type of package technology suggested to satisfy the technical demand as described above is a fan-out semiconductor package. Such a fan-out semiconductor package has a compact size and may allow a plurality of pins to be implemented by redistributing connection terminals outwardly of a region in which a semiconductor chip is disposed.

SUMMARY

An aspect of the present disclosure may provide a fan-out semiconductor package in which a circuit density of a redistribution layer may be increased even in a limited area.

According to an aspect of the present disclosure, a fan-out semiconductor package may be provided, in which connection pads of a semiconductor chip and a redistribution layer are connected to each other in a special form using interconnection members.

According to an aspect of the present disclosure, a fan-out semiconductor package may include: a semiconductor chip having an active surface having connection pads disposed thereon and an inactive surface opposing the active surface; interconnection members attached to the connection pads of the semiconductor chip; an encapsulant encapsulating at least portions of the inactive surface of the semiconductor chip; and a first connection member disposed on the active surface of the semiconductor chip. The first connection member includes a redistribution layer electrically connected to the connection pads of the semiconductor chip through the interconnection members, the redistribution layer of the first connection member includes pads in contact with the interconnection members and wirings connected to the pads, and in a bonding interface between the interconnection member and the pad of the redistribution layer, an area of the interconnection member is greater than that of the pad of the redistribution layer.

According to another aspect of the present disclosure, a fan-out semiconductor package may include: a semiconductor chip having an active surface having connection pads disposed thereon and an inactive surface opposing the active surface; an encapsulant encapsulating at least portions of the inactive surface of the semiconductor chip; an insulating layer disposed on the active surface of the semiconductor chip; interconnection members in contact with the connection pads and embedded in the insulating layer so that one surface thereof are exposed; and a redistribution layer disposed on the insulating layer and connected to the exposed surface of the interconnection member. The redistribution layer includes wirings in direct contact with the interconnection members without using pads.

BRIEF DESCRIPTION OF DRAWINGS

The above and other aspects, features, and advantages of the present disclosure will be more clearly understood from the following detailed description taken in conjunction with the accompanying drawings, in which:

FIGS. 11A through 11C are schematic plan views illustrating connection forms between an interconnection member and a redistribution layer of a first connection member of the fan-out semiconductor package of FIG. 9;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

The meaning of a "connection" of a component to another component in the description includes an indirect connection through an adhesive layer as well as a direct connection between two components. In addition, "electrically connected" encompasses the concepts of a physical connection and a physical disconnection. It can be understood that when an element is referred to using terms such as "first" and "second", the element is not limited thereby. They may only be used for a purpose of distinguishing one element from other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
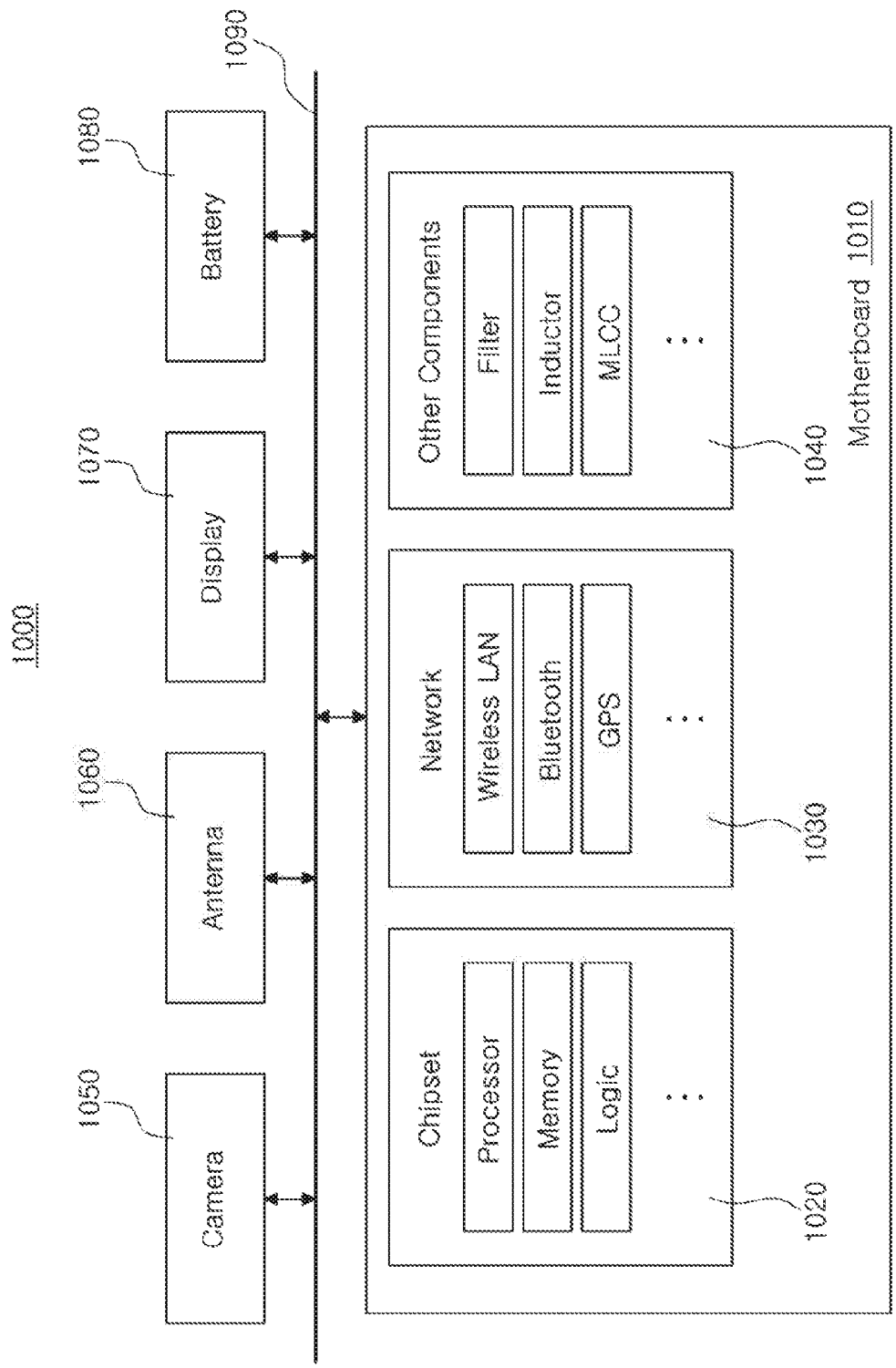
FIG. 1 is a schematic block diagram illustrating an example of an electronic device system.

FIG. 1 is a schematic block diagram illustrating an example of an electronic device system.

Referring to FIG. 1, an electronic device 1000 may accommodate a motherboard 1010 therein. The motherboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the motherboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
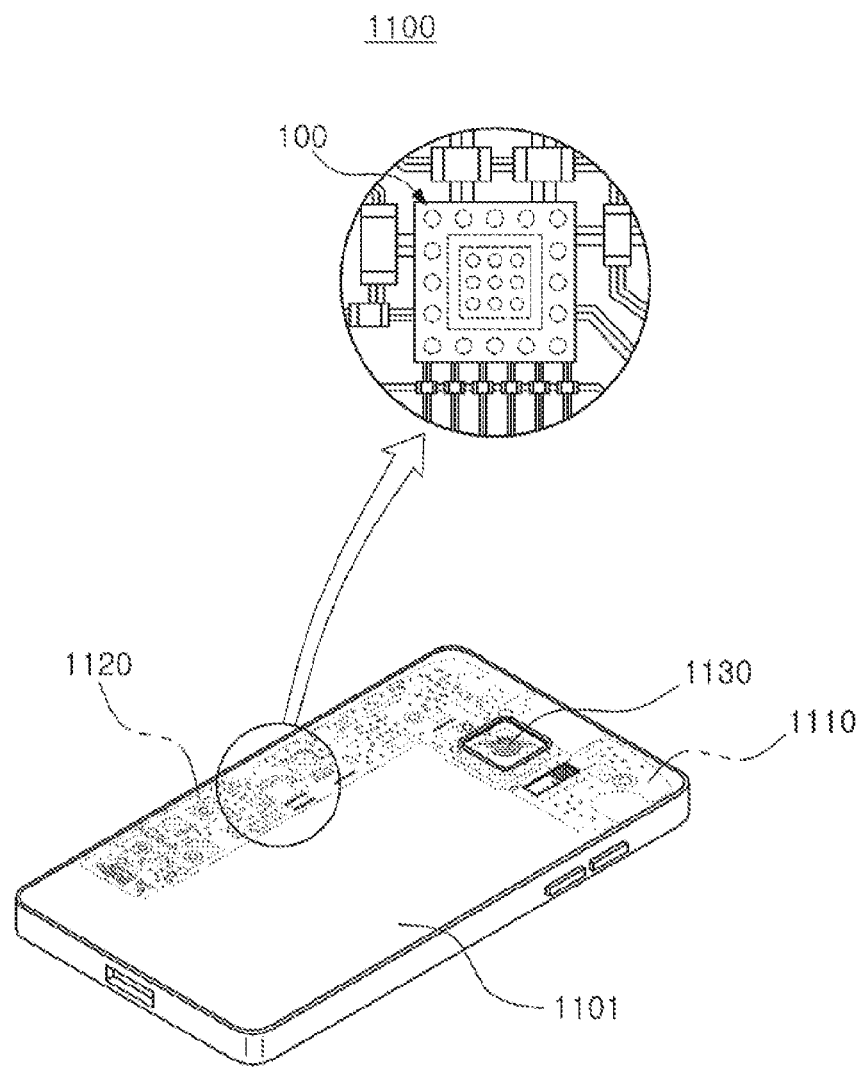
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip related components, and the semiconductor package 100 may be, for example, an application processor, among the chip related components, but is not limited thereto. The electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit widths between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in circuit widths between the semiconductor chip and the main board is required.

A semiconductor package manufactured using the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
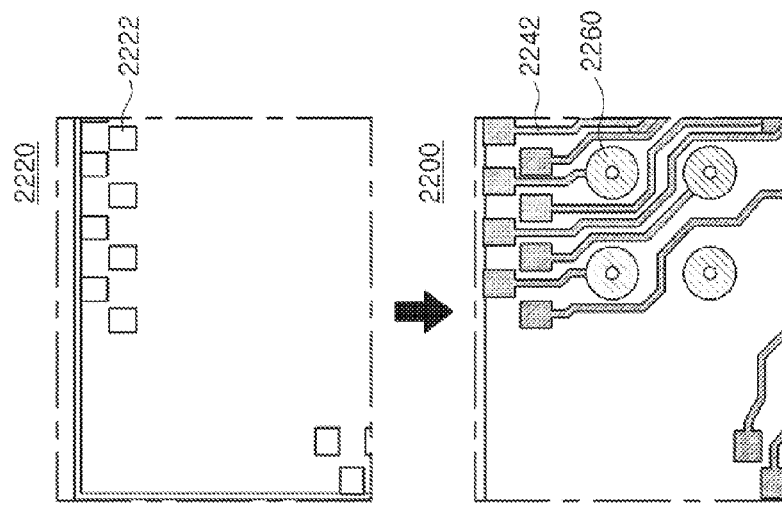
FIGS. 3A and 3B are schematic cross-sectional views illustrating states of a fan-in semiconductor package before and after being packaged.
Figure 3A:
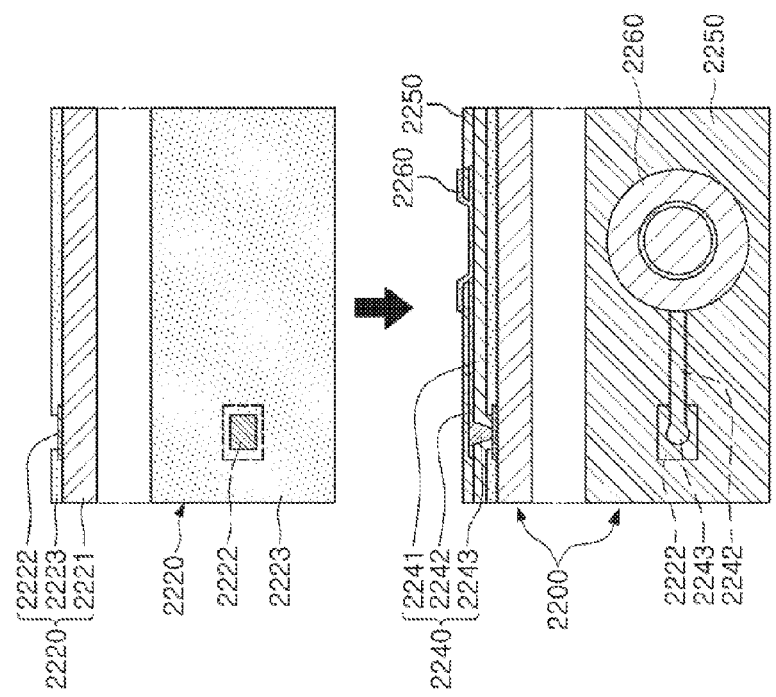

FIGS. 3A and 3B are schematic cross-sectional views illustrating states of a fan-in semiconductor package before and after being packaged.

Figure 4:
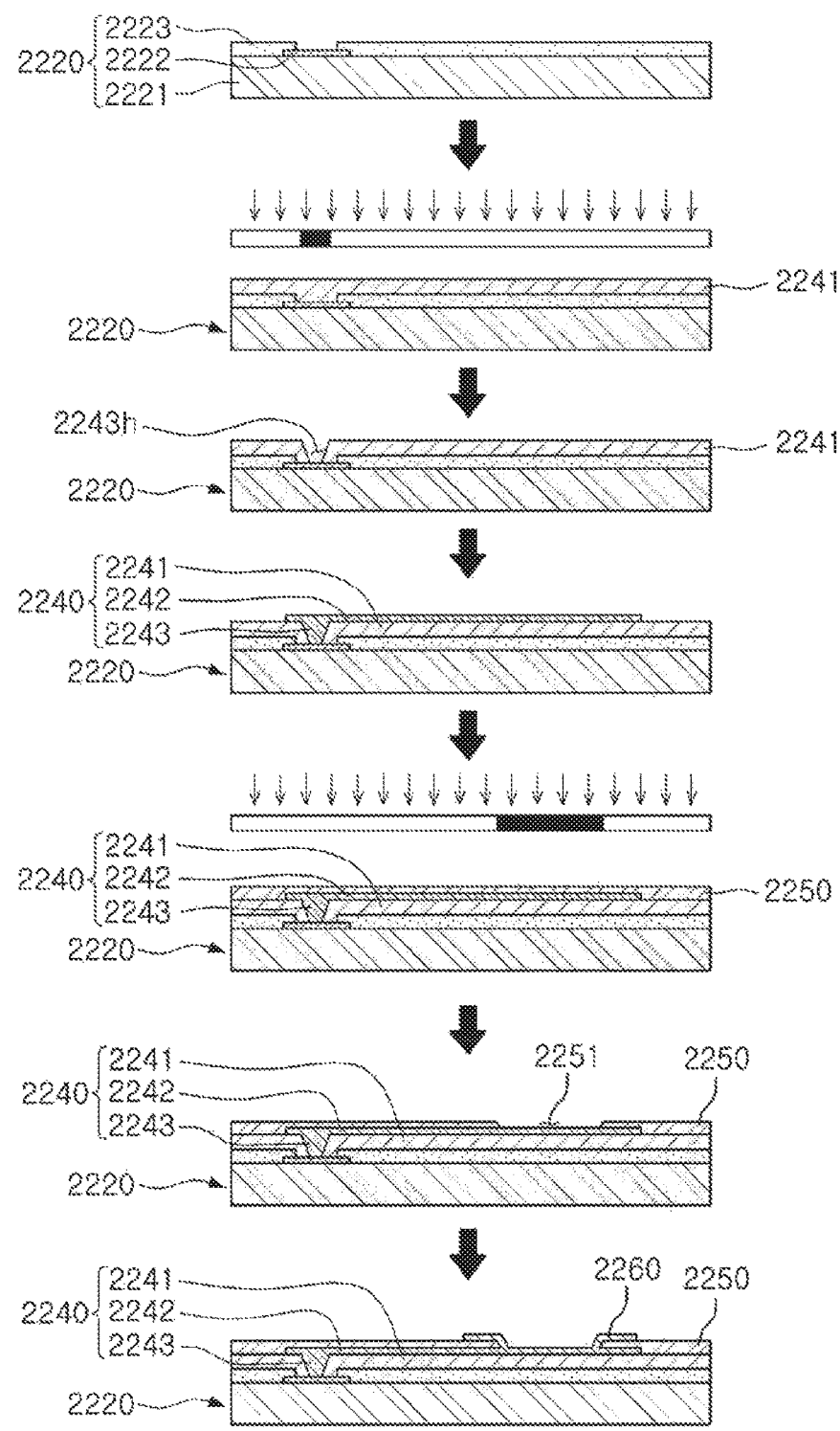
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, a connection member 2240 may be formed on the semiconductor chip 2220, depending on a size of the semiconductor chip 2220, in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a significant spatial limitation. Therefore, it is difficult to apply this structure to a semiconductor chip having a large number of I/O terminals or a semiconductor chip having a compact size. In addition, due to the disadvantages described above, the fan-in semiconductor package may not be directly mounted and used on the main board of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
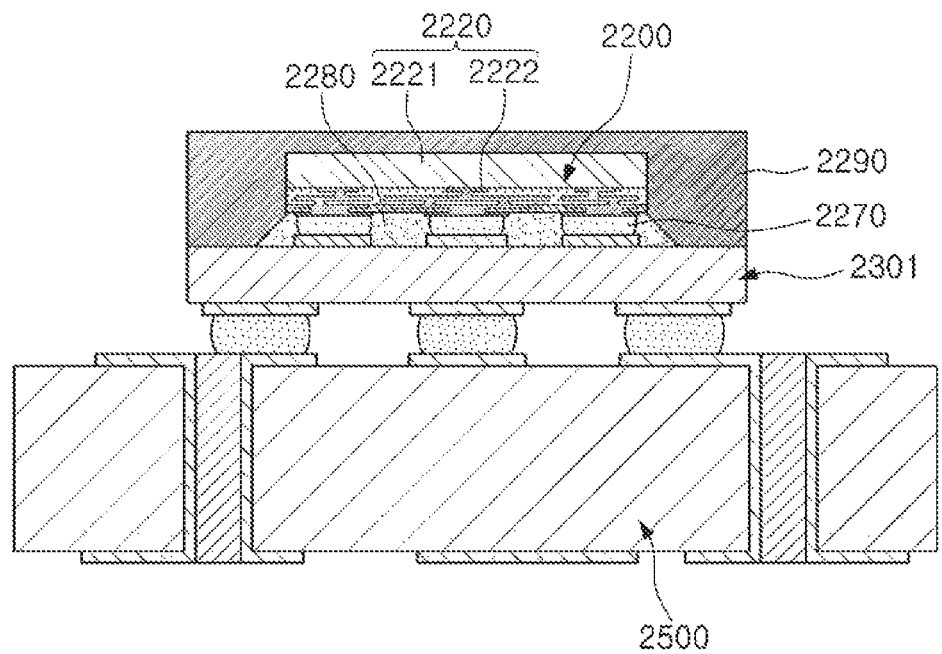
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
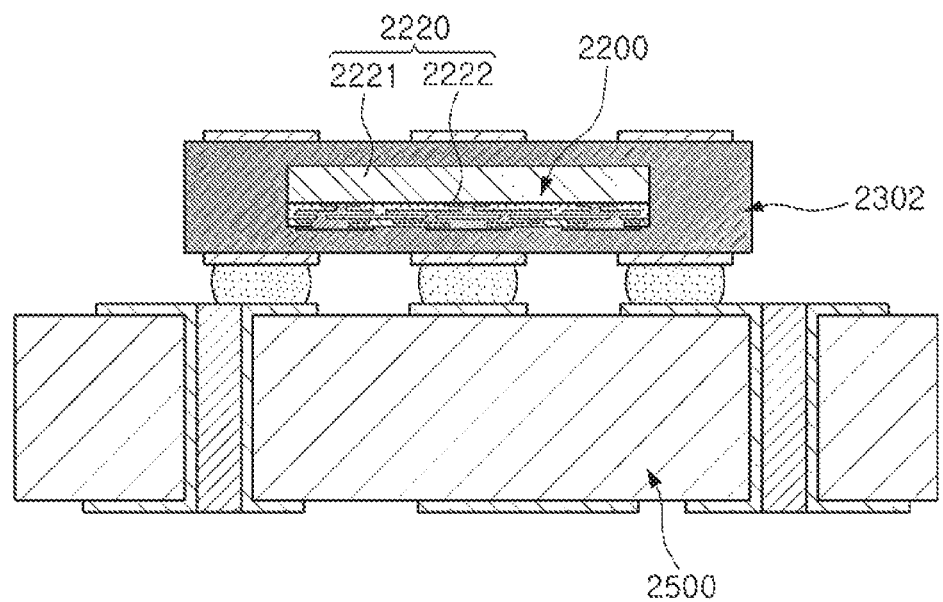
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may again be redistributed through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may again be redistributed by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and then mounted on the main board of the electronic device through a packaging process or may be mounted and used on the main board of the electronic device in a state in which it is embedded in the interposer substrate.

Fan-Out Semiconductor Package

Figure 7:
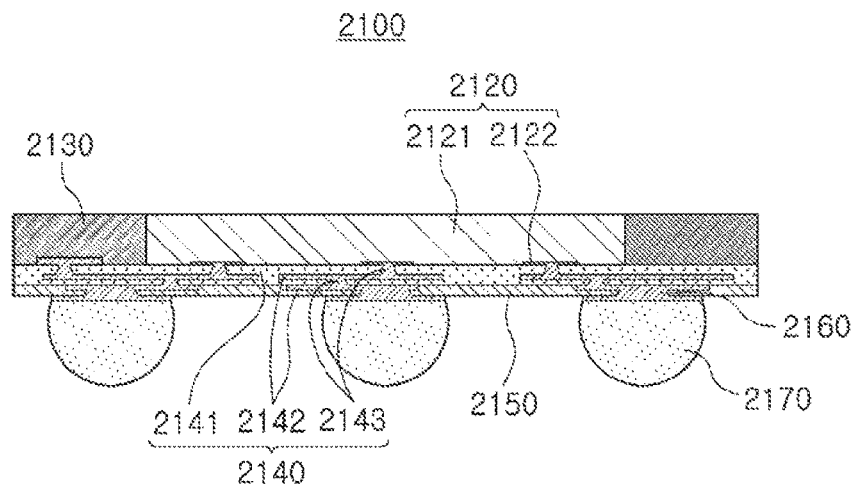
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
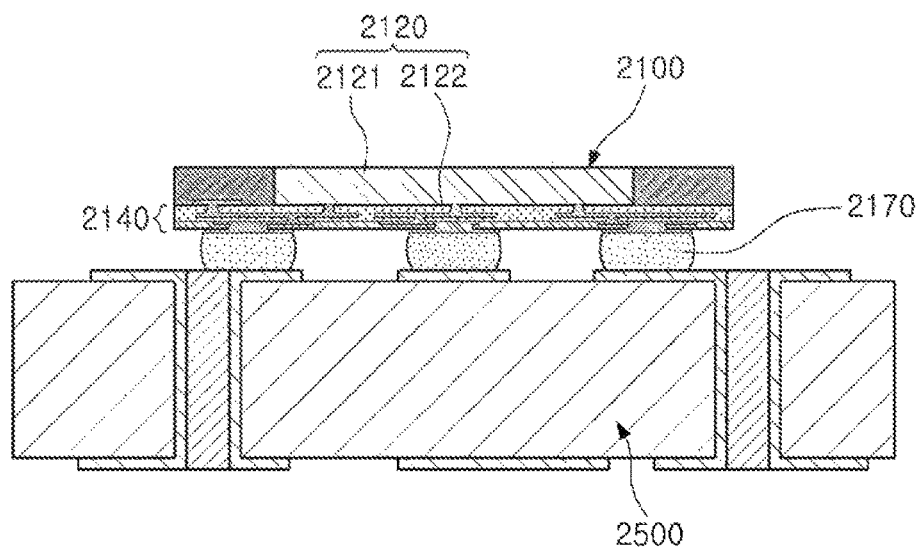
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region having a greater area than that of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented to have a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile device. Therefore, the fan-out semiconductor package may be implemented in a form more compact than that of a general package-on-package (POP) type using a printed circuit board (PCB), and may solve a problem occurring due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is conceptually different from a printed circuit board (PCB) such as an interposer substrate, or the like, having a scale, a purpose, and the like, different from those of the fan-out semiconductor package, and having the fan-in semiconductor package embedded therein.

A fan-out semiconductor package in which a circuit density of a redistribution layer may be increased, even in a limited area, will hereinafter be described with reference to the drawings.

Figure 9:
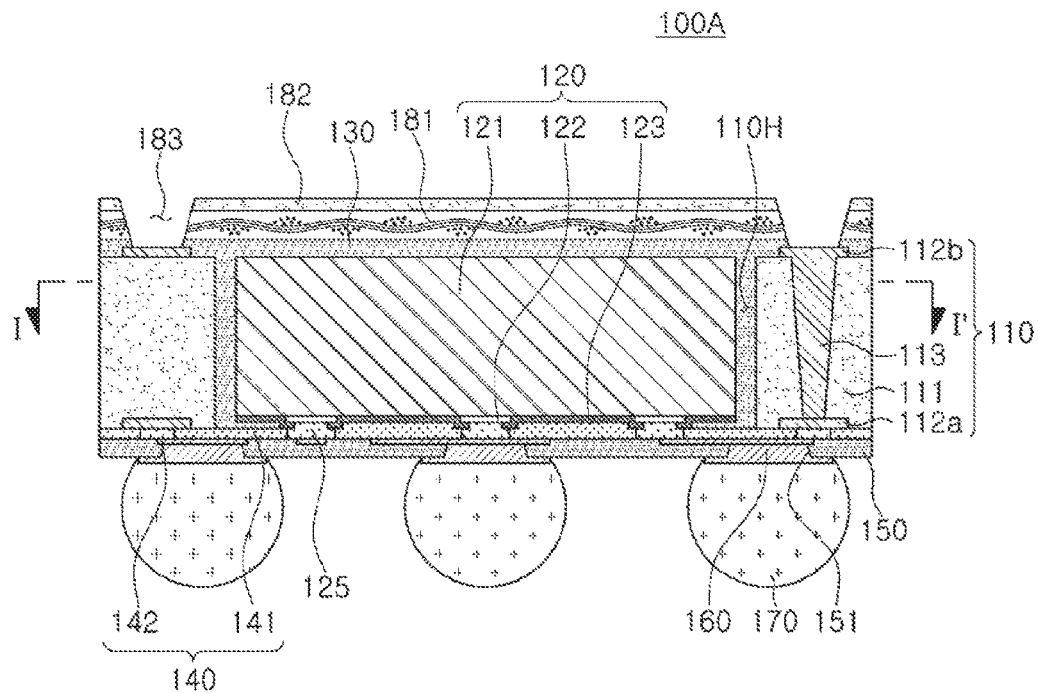
FIG. 9 is a schematic cross-sectional view illustrating an example of a fan-out semiconductor package.

FIG. 9 is a schematic cross-sectional view illustrating an example of a fan-out semiconductor package.

Figure 10:
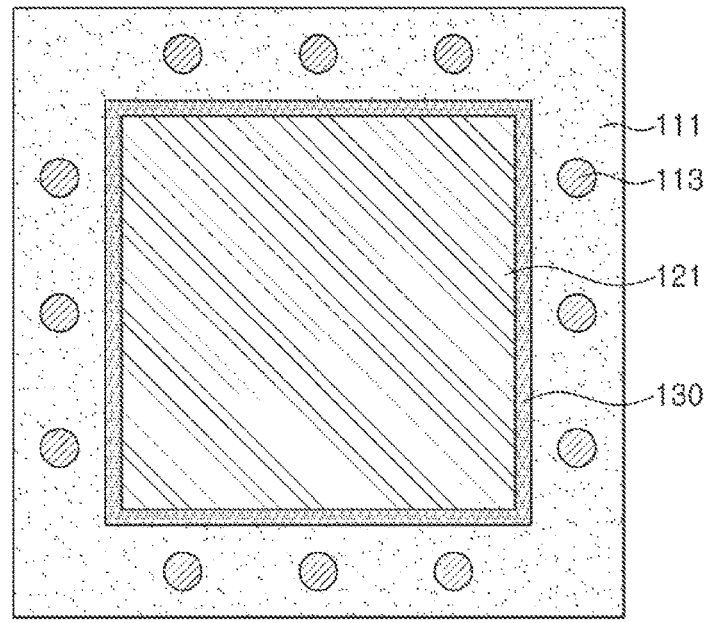
FIG. 10 is a schematic plan view taken along line I-I' of the fan-out semiconductor package of FIG. 9.

FIG. 10 is a schematic plan view taken along line I-I' of the fan-out semiconductor package of FIG. 9.

FIGS. 11A through 11C are schematic plan views illustrating connection forms between an interconnection member and a redistribution layer of a first connection member of the fan-out semiconductor package of FIG. 9.

Referring to the drawings, a fan-out semiconductor package 100A according to an exemplary embodiment in the present disclosure may include a semiconductor chip 120 having an active surface having connection pads 122 disposed thereon and an inactive surface opposing the active surface, interconnection members 125 attached to the connection pads 122 of the semiconductor chip 120, an encapsulant 130 encapsulating at least portions of the inactive surface of the semiconductor chip 120, and a first connection member 140 disposed on the active surface of the semiconductor chip 120. The first connection member 140 may also include a redistribution layer 142 electrically connected to the connection pads 122 of the semiconductor chip 120 through the interconnection members 125. In this case, as illustrated in FIG. 11A, the redistribution layer 142 of the first connection member 140 may include pads 142P in contact with the interconnection member 125 and wirings 142L1 connected to the pads 142P, and in a bonding interface between the interconnection member 125 and the pad 142P, an area of the interconnection member 125 may be greater than that of the pad 142P. Meanwhile, the pad 142P may be disposed in the interconnection member 125 when viewed in a direction perpendicular to the active surface of the semiconductor chip 120. Alternatively, as illustrated in FIGS. 11B and 11C, the redistribution layer 142 of the first connection member 140 may include a wiring 142L2 or 142L3 in direct contact with the interconnection member 125 without using a separate pad. Meanwhile, an end portion of the wiring 142L2 may be disposed in the interconnection member 125 when viewed in a direction perpendicular to the active surface of the semiconductor chip 120. Alternatively, the wiring 142L3 may transverse the interconnection member 125 when viewed in a direction perpendicular to the active surface of the semiconductor chip 120.

Recently, a fan-out wafer level package (FOWLP) product in which a package is implemented in a wafer state has been developed. This technology may substitute for an interposer substrate performing an interconnection role by forming a frame of a product form using a molding material in a wafer state and then forming a circuit layer on portions adjacent to connection pads of a semiconductor chip using a wafer process. Meanwhile, in the wafer level package, generally, in order to electrically connect the connection pads of the semiconductor chip and the circuit layer to each other, a photosensitive insulating layer is formed on the portions adjacent the connection pads of the semiconductor chip, and vias are formed in the photosensitive insulating layer. The vias formed by such a method are connected to the pads occupying a significant area on the photosensitive insulating layer, and there is thus a limitation in increasing circuit density in a limited space at the time of forming circuits of a redistribution layer, or the like. In addition, the vias are formed by a subsequent process after an insulating material is applied, and a decrease in connection force due to generation of voids and unstable plating has frequently occurred.

On the other hand, in the fan-out semiconductor package 100A according to the exemplary embodiment, the interconnection members 125 may be introduced in order to connect the connection pads 122 of the semiconductor chip 120 to the redistribution layer 142. The interconnection member 125 may be, for example, a copper (Cu) pillar having a fine size, and a size of the pad 142P connected to the interconnection member 125 on an insulating layer 141 may be significantly reduced or the pad 142P may be omitted by introducing the interconnection member 125. Therefore, a space in which circuits such as the wirings 142L1, 142L2, and 142L3 are formed may be maximally secured, and circuit density may be increased. In addition, the interconnection member 125 may be introduced before the insulating layer 141 is formed, and may be embedded in the insulating layer 141 to have an exposed surface. Therefore, connection force between the redistribution layer 142 formed on the insulating layer 141 and in contact with the interconnection member 125 and the interconnection member 125 may be improved. Meanwhile, an interface between the interconnection member 125 and the redistribution layer 142 may be disposed on a level corresponding to that of an interface between the insulating layer 141 and the redistribution layer 142, and the redistribution layer 142 may be formed on a flat surface as described above, such that the size of the pad 142P connected to the interconnection member 125 may be significantly reduced and the pad 142P may also be omitted. In addition, connection force may be increased. Meanwhile, the phrase, "corresponding levels," used herein, meaning the same levels, is a concept including a case in which levels are approximately the same as each other, that is, a case in which levels have a slight error in a process therebetween, as well as a case in which levels are entirely the same as each other. This will be similarly applied below.

The respective components included in the fan-out semiconductor package 100A according to the exemplary embodiment will hereinafter be described in more detail.

The semiconductor chip 120 may be an integrated circuit (IC) provided in an amount of several hundreds to several millions of elements, or more, integrated in a single chip. The IC may be, for example, an application processor chip such as a central processor (for example, a CPU), a graphics processor (for example, a GPU), a digital signal processor, a cryptographic processor, a microprocessor, a microcontroller, or the like, but is not limited thereto. The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), or the like, may also be further disposed in other required positions.

The interconnection member 125 may have a pillar shape including a known conductive material such as copper (Cu), aluminum (Al), silver (Ag), tin (Sn), gold (Au), nickel (Ni), lead (Pb), titanium (Ti), or alloys thereof. As a non-restrictive example, the interconnection member 125 may be a copper (Cu) pillar, but is not limited thereto. The interconnection member 125 may be embedded in the insulating layer 141 of the first connection member 140 to have an exposed surface, and the exposed surface of the interconnection member 125 may be flat through a planarization process as described below. The interconnection member 125 may have a fine size, for example, a diameter of 25 μm or less, such as a diameter of 15 μm to 25 μm.

The encapsulant 130 may protect the semiconductor chip 120. An encapsulation form of the encapsulant 130 is not particularly limited, and may be a form in which the encapsulant 130 surrounds at least portions of the semiconductor chip 120. For example, the encapsulant 130 may cover a second connection member 110 to be described below and the inactive surface of the semiconductor chip 120, and fill spaces between walls of a through-hole 110H to be described below and side surfaces of the semiconductor chip 120. In addition, the encapsulant 130 may also fill at least a portion of a space between the passivation layer 123 of the semiconductor chip 120 and the first connection member 140. Meanwhile, the encapsulant 130 may fill the through-hole 110H to thus serve as an adhesive and reduce buckling of the semiconductor chip 120 depending on certain materials.

The encapsulant 130 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as Ajinomoto Buildup Film (ABF), FR-4, Bismaleimide Triazine (BT), a photoimagable dielectric (PID) resin, or the like. In addition, the known molding material such as an epoxy molding compound (EMC), or the like, may also be used. Alternatively, a material in which a thermosetting resin or a thermoplastic resin is impregnated in an inorganic filler and/or a core material such as a glass fiber (or a glass cloth or a glass fabric) may also be used as the insulating material.

The first connection member 140 may be configured to redistribute the connection pads 122 of the semiconductor chip 120. Several ten to several hundred connection pads 122 having various functions may be redistributed by the first connection member 140, and may be physically or electrically connected to an external source through connection terminals 170 to be described below depending on the functions. The first connection member 140 may include the insulating layer 141 and the redistribution layer 142 disposed on the insulating layer 141. In the fan-out semiconductor package 100A according to the exemplary embodiment, the first connection member 140 may include a single layer, and may also include a plurality of layers. When the first connection member 140 includes the plurality of layers, the interconnection member, and the like, as described above may be introduced in order to electrically connect redistribution layers formed on different layers to each other.

A material of each of the insulating layers 141 may be an insulating material. In this case, a photosensitive insulating material such as a PID resin may also be used as the insulating material. When the insulating layers 141 are multiple layers, materials of the insulating layers 141 may be the same as each other, and may also be different from each other, if necessary. When the insulating layers 141 are multiple layers, the insulating layers 141 may be integrated with each other depending on a process, such that a boundary therebetween may also not be apparent. An interface between the insulating layer 141 and the redistribution layer 142 may be disposed on a level corresponding to that of the interface between the interconnection member 125 and the redistribution layer 142. In this case, the redistribution layer 142 may be formed on the flat surface, such that the size of the pad 142P connected to the interconnection member 125 may be significantly reduced as illustrated in FIG. 11A, or the pad 142P may be omitted as illustrated in FIGS. 11B and 11C.

The redistribution layers 142 may serve to substantially redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include pads, and the like. In the bonding interface between the interconnection member 125 and the pad 142P, the area of the interconnection member 125 may be greater than that of the pad 142P. Alternatively, the redistribution layer 142 of the first connection member 140 may include the wiring 142L2 or 142L3 in direct contact with the interconnection member 125 without using a separate pad. Meanwhile, the pad 142P may be disposed in the interconnection member 125 when viewed in a direction perpendicular to the active surface of the semiconductor chip 120. Alternatively, an end portion of the wiring 142L2 may be disposed in the interconnection member 125 when viewed in a direction perpendicular to the active surface of the semiconductor chip 120. Alternatively, the wiring 142L3 may transverse the interconnection member 125 when viewed in a direction perpendicular to the active surface of the semiconductor chip 120.

The fan-out semiconductor package 100A according to the exemplary embodiment may further include the second connection member 110 having a through-hole 110H, if necessary. The second connection member 110 may maintain rigidity of the fan-out semiconductor package 100A depending on certain materials, and serve to secure uniformity of a thickness of the encapsulant 130. The fan-out semiconductor package 100A may be used as a portion of a package-on-package (POP) by the second connection member 110. When the second connection member 110 includes redistribution layers 112a and 112b, the number of layers of first connection member 140 may be reduced, such that the fan-out semiconductor package 100A may be thinned and a yield problem due to a defect occurring in a process of manufacturing the first connection member 140 may be suppressed. The semiconductor chip 120 may be disposed in the through-hole 110H to be spaced apart from the second connection member 110 by a predetermined distance. The side surfaces of the semiconductor chip 120 may be surrounded by the second connection member 110. However, such a form is only an example and may be variously modified to have other forms, and the first connection member 110 may perform another function depending on such a form.

The second connection member 110 may include an insulating layer 111, a first redistribution layer 112a in contact with the interconnection members 125 and embedded in the insulating layer 111, and a second redistribution layer 112b disposed on the other surface of the insulating layer 111 opposing one surface of the insulating layer 111 in which the first redistribution layer 112a is embedded. The first and second redistribution layers 112a and 112b may be electrically connected to each other through vias 113. Since the first redistribution layer 112a is embedded in the insulating layer 111, an insulating distance of the insulating layer 141 of the first connection member 140 may be substantially constant. The first redistribution layer 112a may be connected to the redistribution layer 142 of the first connection member 140 in the form described above through the interconnection member 125. Thicknesses of the redistribution layers 112a and 112b of the second connection member 110 may be greater than that of the redistribution layer 142 of the first connection member 140. Since the second connection member 110 may have a thickness equal to or greater than that of the semiconductor chip 120, the redistribution layers 112a and 112b may be formed to have large sizes, depending on a scale of the second connection member 110. On the other hand, the redistribution layer 142 of the first connection member 140 may be formed at a relatively smaller size for thinness.

The fan-out semiconductor package 100A according to the exemplary embodiment may further include a passivation layer 150, if necessary. The passivation layer 150 may be additionally configured to protect the first connection member 140 from external physical or chemical damage. The passivation layer 150 may have openings 151 exposing at least portions of the redistribution layer 142 of the first connection member 140. The openings may be provided in an amount of several tens to several thousands.

A material of the passivation layer 150 is not particularly limited, but may be a photosensitive insulating material such as a PID resin. Alternatively, a solder resist may also be used as the material of the passivation layer 150. Alternatively, an insulating resin that does not include a core material, but includes a filler, for example, ABF, including an inorganic filler and an epoxy resin, may be used as the material of the passivation layer 150. When an insulating material that includes an inorganic filler and an insulating resin, but does not include a core material, such as the ABF, or the like, is used as the material of the passivation layer 150, the passivation layer 150 and a resin layer 182 to be described below may have an opposite effect to each other, and may control warpage dispersion, which may be more effective in controlling warpage. When the insulating material including the inorganic filler and the insulating resin, such as the ABF, or the like, is used as the material of the passivation layer 150, the insulating layer 141 of the first connection member 140 may also include an inorganic filler and an insulating resin. In this case, a weight percentage of the inorganic filler included in the passivation layer 150 may be greater than that of the inorganic filler included in the insulating layer 141 of the first connection member 140. In this case, the passivation layer 150 may have a relatively low coefficient of thermal expansion (CTE), and may be utilized to control the warpage.

The fan-out semiconductor package 100A according to the exemplary embodiment may further include an underbump metal layer 160, if necessary. The underbump metal layer 160 may be additionally configured to improve connection reliability of the connection terminals 170 and improve board level reliability of the fan-out semiconductor package 100A. The underbump metal layer 160 may be connected to the redistribution layer 142 of the first connection member 140 opened through the openings 151 of the passivation layer 150. The underbump metal layer 160 may be formed in the openings 151 of the passivation layer 150 by the known metallization method using the known conductive metal such as a metal, but is not limited thereto.

The fan-out semiconductor package 100A according to the exemplary embodiment may further include the connection terminals 170, if necessary. The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto.

The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of several tens to several thousands or more or several tens to several thousands or less. When the connection terminals 170 are solder balls, the connection terminals 170 may cover side surfaces of the underbump metal layer 160 extending onto one surface of the passivation layer 150, and connection reliability may be more excellent.

At least one of the connection terminals 170 may be disposed in a fan-out region. The fan-out region is a region except for a region in which the semiconductor chip 120 is disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a reduced thickness, and may have price competitiveness.

The fan-out semiconductor package 100A according to the exemplary embodiment may further include a reinforcing layer 181, if necessary. The reinforcing layer 181 may improve rigidity of the fan-out semiconductor package 100A. The reinforcing layer 181 may have an elastic modulus relatively greater than that of the encapsulant 130, and may have a coefficient of thermal expansion (CTE) smaller than that of the encapsulant 130. In this case, a warpage suppression effect may be excellent. The reinforcing layer 181 may include an insulating resin, a core material, a filler, and the like. For example, the reinforcing layer 181 may be formed of an unclad copper clad laminate (CCL), prepreg, or the like. When the reinforcing layer 181 includes the core material such as a glass fiber (or a glass cloth or a glass fabric), or the like, the reinforcing layer 181 may be implemented to have a relatively large elastic modulus, and when the reinforcing layer 181 includes the filler, the reinforcing layer 181 may be implemented to have a relatively small CTE by adjusting a content of the filler. The reinforcing layer 181 may be attached in a c-stage to the encapsulant 130. In this case, an interface between the encapsulant 130 and the reinforcing layer 181 may be approximately linear, but is not limited thereto. In some cases, the reinforcing layer 181 may be attached to the encapsulant 130 in a b-stage, such that the interface between the encapsulant 130 and the reinforcing layer 181 may be approximately non-linear. Meanwhile, the filler may be an inorganic filler such as silica, alumina, or the like, and the insulating resin may be a thermosetting resin such as an epoxy resin or a thermoplastic resin such as a polyimide resin.

The fan-out semiconductor package 100A according to the exemplary embodiment may further include a resin layer 182, if necessary. The resin layer 182 may be disposed on the reinforcing layer 181. The resin layer 182 may be formed of a material that is the same as or similar to that of the encapsulant 130, for example, an insulating material that includes an insulating resin and a filler, but does not include a core material, that is, ABF, or the like. When the reinforcing layer 181 includes the core material, or the like, it is difficult to form openings 183 in the reinforcing layer 181 itself, but when the resin layer 182 is added, the openings 183 may be easily formed. In this viewpoint, the openings 183 may also penetrate through the resin layer 182. The insulating resin may be a thermosetting resin such as an epoxy resin or a thermoplastic resin such as a polyimide resin. The filler may be an inorganic filler such as silica, alumina, or the like.

Meanwhile, although not illustrated in the drawings, a metal layer may further be disposed on the wall of the through-hole 110H, if necessary. The metal layer may serve to effectively dissipate heat generated by the semiconductor chip 120. In addition, the metal layer may also serve to block electromagnetic waves. In addition, a separate passive component such as a capacitor, an inductor, or the like, may further be disposed in the through-hole 110H. In addition, a plurality of semiconductor chips 120 may be disposed in the through-hole 110H. In addition, the number of through-holes 110H may be plural and semiconductor chips 120 or passive components may be disposed in the through-holes 110H, respectively. In addition to the structures described above, the structures known in the related art may be applied.

Figure 12A:
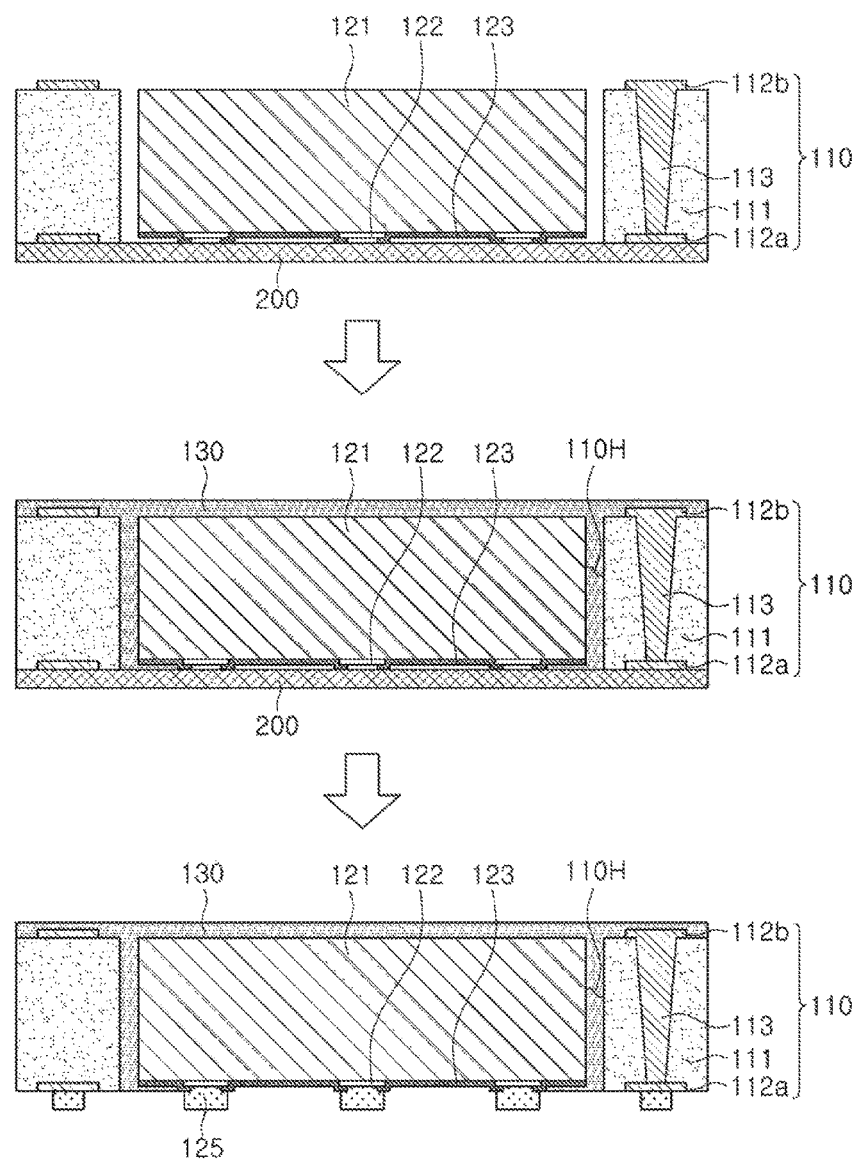
FIGS. 12A and 12B are schematic views illustrating an example of processes of manufacturing the fan-out semiconductor package of FIG. 9.
Figure 12B:
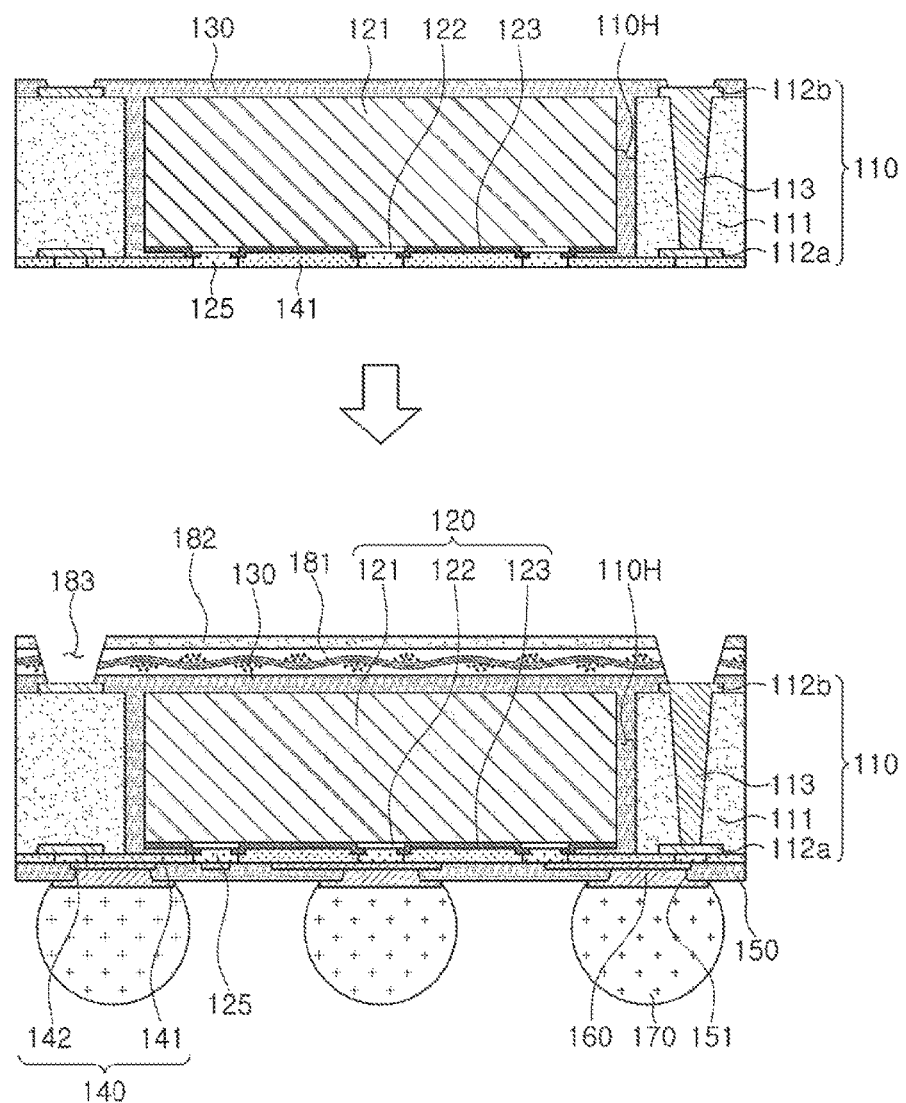

FIGS. 12A and 12B are schematic views illustrating an example of processes of manufacturing the fan-out semiconductor package of FIG. 9.

Referring to FIG. 12A, the second connection member 110 may be first prepared. Then, the second connection member 110 may be attached to a temporary film 200 such as an adhesive film, or the like. Then, the semiconductor chip 120 may be attached to the temporary film 200 exposed through the through-hole 110H in a face-down form to thus be disposed in the through-hole 110H. Then, at least portions of the semiconductor chip 120 may be encapsulated using the encapsulant 130. The encapsulant 130 may be formed by a known method. For example, the encapsulant 130 may be formed by a method of laminating a precursor of the encapsulant 130 on the temporary film 200 and then hardening the precursor. Alternatively, the encapsulant 130 may be formed by a method of applying a pre-encapsulant to the temporary film 200 to encapsulate the semiconductor chip 120 and then hardening the pre-encapsulant. Then, the temporary film 200 may be removed. Then, the interconnection members 125 may be formed in regions in which the temporary film 200 is removed. The interconnection members 125 may be formed by a litho via process or may be formed by a method of attaching copper pillars, or the like, to regions of the connection pads 122 on a wafer, but are not limited thereto.

Referring to FIG. 12B, then, the insulating layer 141 may be formed. Then, a grinding process may be performed on the interconnection members 125 as well as the insulating layer 141 to form a flat surface. Then, a seed layer may be formed using sputtering, or the like, pads and/or circuit designs may be formed using a dry film resist (DFR), or the like, and empty portions may be filled by plating, or the like, to form the redistribution layer 142, thereby forming the first connection member 140. The dry film resist and an unnecessary seed layer may be removed by an etching process, or the like. Exposure and development may be performed on the flat surface using the dry film resist to finely implement pads and circuits in a given area. Therefore, a degree of freedom of a design may be increased due to an increase in a circuit density in the same area. The passivation layer 150, the reinforcing layer 181, and the resin layer 182 may be formed by the known lamination method, or the like, if necessary. In addition, the underbump metal layer 160 may be formed by the known metallization method. Further, the connection terminal connections 170 may be formed by the known method.

Figure 13:
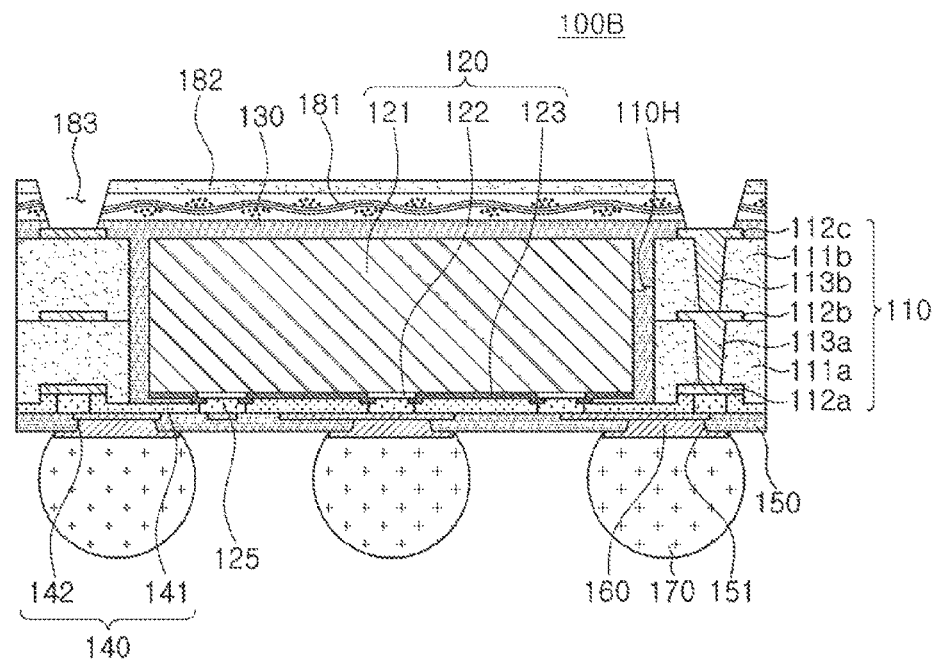
FIG. 13 is a schematic cross-sectional view illustrating another example of a fan-out semiconductor package.

FIG. 13 is a schematic cross-sectional view illustrating another example of a fan-out semiconductor package.

Referring to the drawing, in a fan-out semiconductor package 100B according to another exemplary embodiment in the present disclosure, a second connection member 110 may include a first insulating layer 111a, a first redistribution layer 112a in contact with interconnection members 125 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 122. The first and second redistribution layers 112a and 112b and the second and third redistribution layers 112b and 112c may be electrically connected to each other through first and second vias 113a and 113b penetrating through the first and second insulating layers 111a and 111b, respectively.

Since the first redistribution layer 112a is embedded in the first insulating layer 111a, an insulating distance of an insulating layer 141 of the first connection member 140 may be substantially constant, as described above. Since the second connection member 110 may include a large number of redistribution layers 112a, 112b, and 112c, the first connection member 140 may further be simplified. Therefore, a decrease in a yield depending on a defect occurring in a process of forming the first connection member 140 may be suppressed. The first redistribution layer 112a may be recessed in the first insulating layer 111a, such that a lower surface of the first insulating layer 111a may have a step with respect to a lower surface of the first redistribution layer 112a. Resultantly, when an encapsulant 130 is formed, a phenomenon in which a material of the encapsulant 130 bleeds to pollute the first redistribution layer 112a may be prevented.

The lower surface of the first redistribution layer 112a of the second connection member 110 may be disposed on a level above a lower surface of the connection pad 122 of the semiconductor chip 120. In addition, a distance between a redistribution layer 142 of the first connection member 140 and the first redistribution layer 112a of the second connection member 110 may be greater than that between the redistribution layer 142 of the first connection member 140 and the connection pad 122 of the semiconductor chip 120. The reason is that the first redistribution layer 112a may be recessed into the first insulating layer 111a. The second redistribution layer 112b of the second connection member 110 may be disposed on a level between an active surface and an inactive surface of the semiconductor chip 120. The second connection member 110 may be formed to have a thickness corresponding to that of the semiconductor chip 120. Therefore, the second redistribution layer 112b formed in the second connection member 110 may be disposed on a level between the active surface and the inactive surface of the semiconductor chip 120.

Thicknesses of the redistribution layers 112a, 112b, and 112c of the second connection member 110 may be greater than that of the redistribution layer 142 of the first connection member 140. Since the second connection member 110 may have a thickness equal to or greater than that of the semiconductor chip 120, the redistribution layers 112a, 112b, and 112c may be formed to have large sizes, depending on a scale of the second connection member 110. On the other hand, the redistribution layer 142 of the first connection member 140 may be formed at a relatively smaller size for thinness.

Descriptions of configurations and manufacturing methods overlapping those provided above will be omitted hereinafter.

Figure 14:
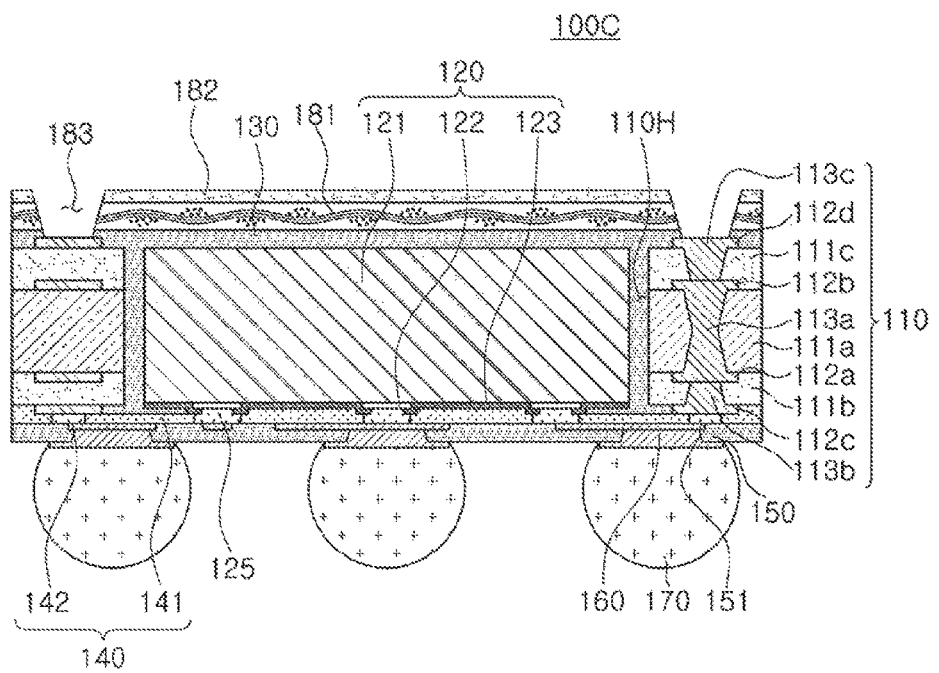
FIG. 14 is a schematic cross-sectional view illustrating another example of a fan-out semiconductor package.

FIG. 14 is a schematic cross-sectional view illustrating another example of a fan-out semiconductor package.

Referring to the drawing, in a fan-out semiconductor package 100C according to another exemplary embodiment in the present disclosure, a second connection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to connection pads 122. Since the second connection member 110 may include a larger number of redistribution layers 112a, 112b, 112c, and 112d, a first connection member 140 may further be simplified. Therefore, a decrease in a yield depending on a defect occurring in a process of forming the first connection member 140 may be suppressed. The first to fourth redistribution layers 112a, 112b, 112c, and 112d may be electrically connected to each other through first to third vias 113a, 113b, and 113c penetrating through the first to third insulating layers 111a, 111b, and 111c, respectively.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto. Similarly, the first via 113a may have a diameter greater than those of the second via 113b and the third via 113c.

A lower surface of the third redistribution layer 112c of the second connection member 110 may be disposed on a level below a lower surface of the connection pad 122 of a semiconductor chip 120. In addition, a distance between a redistribution layer 142 of the first connection member 140 and the third redistribution layer 112c of the second connection member 110 may be smaller than that between the redistribution layer 142 of the first connection member 140 and the connection pad 122 of the semiconductor chip 120. The reason is that the third redistribution layer 112c may be disposed in a protruding form on the second insulating layer 111b, resulting in contacting the first connection member 140. The first redistribution layer 112a and the second redistribution layer 112b of the second connection member 110 may be disposed on a level between an active surface and an inactive surface of the semiconductor chip 120. The second connection member 110 may be formed to have a thickness corresponding to that of the semiconductor chip 120. Therefore, the first redistribution layer 112a and the second redistribution layer 112b formed in the second connection member 110 may be disposed on a level between the active surface and the inactive surface of the semiconductor chip 120.

Thicknesses of the redistribution layers 112a, 112b, 112c, and 112d of the second connection member 110 may be greater than that of the redistribution layer 142 of the first connection member 140. Since the second connection member 110 may have a thickness equal to or greater than that of the semiconductor chip 120, the redistribution layers 112a, 112b, 112c, and 112d may be formed at large sizes. On the other hand, the redistribution layer 142 of the first connection member 140 may be formed at a relatively smaller size for thinness.

Descriptions of configurations and manufacturing methods overlapping those provided above will be omitted hereinafter.

As set forth above, according to the exemplary embodiments in the present disclosure, a fan-out semiconductor package in which a circuit density of a redistribution layer may be increased even in a limited area may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
a semiconductor chip having an active surface having connection pads disposed thereon and an inactive surface opposing the active surface;
an insulating layer having openings exposing portions of the connection pads of the semiconductor chip;
interconnection members disposed in the openings of the insulating layer and attached to the connection pads of the semiconductor chip, respectively, lower surfaces of the interconnection members being coplanar with a lower surface of the insulating layer; and
a first connection member disposed on the active surface of the semiconductor chip,
wherein the first connection member includes a redistribution layer including conductive patterns electrically connected to the connection pads of the semiconductor chip at least through the interconnection members,
one of the conductive patterns of the redistribution layer is in physical contact with the lower surface of the insulating layer and a lower surface of one of the interconnection members, and extends from the lower surface of the insulating layer onto the lower surface of the one of the interconnection members, and
in a view along a direction perpendicular to the active surface of the semiconductor chip, a width of the one of the interconnection members is greater than a width of the one of the conductive patterns of the redistribution layer.

2. The semiconductor package of claim 1, wherein the interconnection member includes a copper pillar.

3. The semiconductor package of claim 1, further comprising a second connection member having a through-hole,
wherein the semiconductor chip is disposed in the through-hole.

4. The semiconductor package of claim 3, wherein the second connection member includes a first insulating layer, a first redistribution layer connected to the interconnection members and embedded in the first insulating layer, and a second redistribution layer disposed on the other surface of the first insulating layer opposing one surface of the first insulating layer in which the first redistribution layer is embedded, and
the first and second redistribution layers are electrically connected to the connection pads of the semiconductor chip.

5. The semiconductor package of claim 4, wherein the second connection member further includes a second insulating layer disposed on the first insulating layer and covering the second redistribution layer and a third redistribution layer disposed on the second insulating layer, and
the third redistribution layer is electrically connected to the connection pads of the semiconductor chip.

6. The semiconductor package of claim 5, wherein the second redistribution layer is disposed on a level between the active surface and the inactive surface of the semiconductor chip.

7. The semiconductor package of claim 4, wherein a distance between the redistribution layer of the first connection member and the first redistribution layer is greater than that between the redistribution layer of the first connection member and the connection pads of the semiconductor chip.

8. The semiconductor package of claim 3, wherein the second connection member includes a first insulating layer, a first redistribution layer and a second redistribution layer disposed on opposite surfaces of the first insulating layer, respectively, a second insulating layer disposed on the first insulating layer and covering the first redistribution layer, and a third redistribution layer disposed on the second insulating layer, and the first to third redistribution layers are electrically connected to the connection pads of the semiconductor chip.

9. The semiconductor package of claim 8, wherein the second connection member further includes a third insulating layer disposed on the first insulating layer and covering the second redistribution layer and a fourth redistribution layer disposed on the third insulating layer, and the fourth redistribution layer is electrically connected to the connection pads of the semiconductor chip.

10. The semiconductor package of claim 8, wherein the first insulating layer has a thickness greater than that of the second insulating layer.

11. The semiconductor package of claim 8, wherein the first redistribution layer is disposed on a level between the active surface and the inactive surface of the semiconductor chip.

12. The semiconductor package of claim 3, further comprising an encapsulant encapsulating at least portions of the inactive surface of the semiconductor chip and portions of the second connection member, and filling portions of the through-hole of the second connection member.

13. The semiconductor package of claim 1, wherein a portion of the one of the conductive patterns of the redistribution layer, which is in physical contact with the lower surface of the one of the interconnection members, includes a wiring linearly extending on the lower surface of the one of the interconnection members.

14. The semiconductor package of claim 1, wherein a portion of the conductive patterns of the redistribution layer, which is in physical contact with the lower surface of the one of the interconnection members, includes a pad and a wiring having a width less than that of the pad and extending from the pad.

15. The semiconductor package of claim 1, further comprising a passivation layer disposed on the insulating layer and having openings exposing portions of the redistribution layer, wherein at least one of the openings of the passivation layer is disposed in a fan-out region.

16. A semiconductor package comprising:

a semiconductor chip having an active surface having connection pads disposed thereon and an inactive surface opposing the active surface;

a connection member having a through-hole, in which the semiconductor chip is disposed, and a first redistribution layer disposed on a lower surface of the connection member;

an encapsulant encapsulating at least portions of the inactive surface of the semiconductor chip and portions of the connection member, and filling portions of the through-hole of the connection member;

an insulating layer disposed on the connection member and the active surface of the semiconductor chip and being in contact with the portions of the encapsulant filling the through-hole of the connection member, the insulating layer including openings exposing portions of the first redistribution layer of the connection member and portions of the connection pads of the semiconductor chip;

interconnection members filling the openings of the insulating layer and being in contact with the connection pads the semiconductor chip and the first redistribution layer of the connection member; and a second redistribution layer disposed on the insulating layer and connected to portions of the interconnection members exposed from the insulating layer, wherein the second redistribution layer includes a conductive pattern in physical contact with one of the interconnection members and having a width less than that of the one of the interconnection members.

17. The semiconductor package of claim 16, wherein an end portion of the conductive pattern is disposed in the one of the interconnection members and is spaced apart from an edge of the one of the interconnection members, when viewed in a direction perpendicular to the active surface of the semiconductor chip.

18. The semiconductor package of claim 17, wherein the conducive pattern includes a pad as an end portion of the conductive pattern and a wiring having a width less than that of the pad and extending from the pad.

19. The semiconductor package of claim 16, wherein the conducive pattern maintains the width and transverses the interconnection member when viewed in a direction perpendicular to the active surface of the semiconductor chip.

20. The semiconductor package of claim 16, further comprising a passivation layer disposed on the insulating layer and having openings exposing portions of the second redistribution layer, wherein at least one of the openings of the passivation layer is disposed in a fan-out region.

\* \* \* \* \*